(12) United States Patent
Fürst et al.

(10) Patent No.: US 7,476,906 B2
(45) Date of Patent: Jan. 13, 2009

(54) PHOTODIODE ARRAY AND METHOD FOR ESTABLISHING A LINK BETWEEN A FIRST SEMICONDUCTOR ELEMENT AND A SECOND SEMICONDUCTOR ELEMENT

(75) Inventors: Robert Fürst, Freising (DE); Mathias Kämpf, Burglengenfeld (DE); Melanie Ring, München (DE); Frank Singer, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 166 days.

(21) Appl. No.: 10/501,209

(22) PCT Filed: Jan. 9, 2002

(86) PCT No.: PCT/DE02/00067

§ 371 (c)(1), (2), (4) Date: Jan. 6, 2005

(87) PCT Pub. No.: WO03/058720

PCT Pub. Date: Jul. 17, 2003

(65) Prior Publication Data

US 2005/0110025 A1 May 26, 2005

(51) Int. Cl.
*H01L 31/12* (2006.01)
(52) U.S. Cl. ...................................... 257/83
(58) Field of Classification Search ............ 257/79–84, 257/E33
See application file for complete search history.

(56) References Cited

U.S. PATENT DOCUMENTS

| 4,143,385 | A | | 3/1979 | Miyoshi et al. |
| 4,636,647 | A | * | 1/1987 | Nishizawa .................. 250/551 |
| 4,817,849 | A | * | 4/1989 | Yamamoto et al. .......... 228/103 |
| 5,535,296 | A | * | 7/1996 | Uchida ........................ 385/89 |
| 6,250,820 | B1 | | 6/2001 | Melchior et al. |
| 6,271,049 | B1 | | 8/2001 | Auracher et al. |
| 2002/0028390 | A1 | * | 3/2002 | Mazed ........................... 430/5 |
| 2005/0063636 | A1 | * | 3/2005 | Joyner ......................... 385/14 |

FOREIGN PATENT DOCUMENTS

| DE | 196 19 921 A1 | 12/1996 |
| DE | 197 09 842 | 10/1998 |
| EP | 0 660 467 A1 | 6/1995 |
| EP | 0 982 818 A2 | 3/2000 |

* cited by examiner

*Primary Examiner*—Nathan W Ha
(74) *Attorney, Agent, or Firm*—Fish & Richardson P.C.

(57) ABSTRACT

The invention relates to a photodiode array comprising a photodiode and a submount, via which the photodiode is contacted, said photodiode and said submount being interlinked by eutectic bonding. The invention further relates to a method for establishing a link between a first semiconductor element and a second semiconductor element which have different outer contours, the two elements being interlinked by eutectic bonding when already being present as a wafer composite. The two interlinked wafers are subdivided one by one and independently of each other in accordance with the desired outer contour.

14 Claims, 7 Drawing Sheets

(PRIOR ART)

PHOTODIODE ARRAY AND METHOD FOR ESTABLISHING A LINK BETWEEN A FIRST SEMICONDUCTOR ELEMENT AND A SECOND SEMICONDUCTOR ELEMENT

RELATED APPLICATION

This application is a national stage application of International Application No. PCT/DE02/00067 filed Jan. 9, 2002, which is entitled "PHOTODIODE ARRAY AND METHOD FOR ESTABLISHING A LINK BETWEEN A FIRST SEMICONDUCTOR ELEMENT AND A SECOND SEMICONDUCTOR ELEMENT", which was not published in English, which is hereby incorporated by reference in its entirety.

FIELD OF THE INVENTION

The invention relates to a photodiode arrangement having a photodiode and a submount, via which the photodiode is electrically contact-connected, and a method for producing a connection between a first semiconductor component and a second semiconductor component, in particular between a photodiode and a submount for a photodiode, the semiconductor components connected to one another having a different outer contour.

BACKGROUND OF THE INVENTION

DE 197 09 842 C1 discloses an electro-optical coupling assembly with a laser diode arrangement in which a plurality of vertically emitting VCSEL laser diodes are arranged in an array. The laser diodes are assigned optical waveguides which are arranged in one plane and whose coupling-side end faces effect beam deflection of the light emitted by the laser diodes into the optical waveguides.

It is known, in the case of such laser diode arrangements, to provide one or more monitor diodes via which the laser diode arrangement is monitored and controlled.

Figure 7:
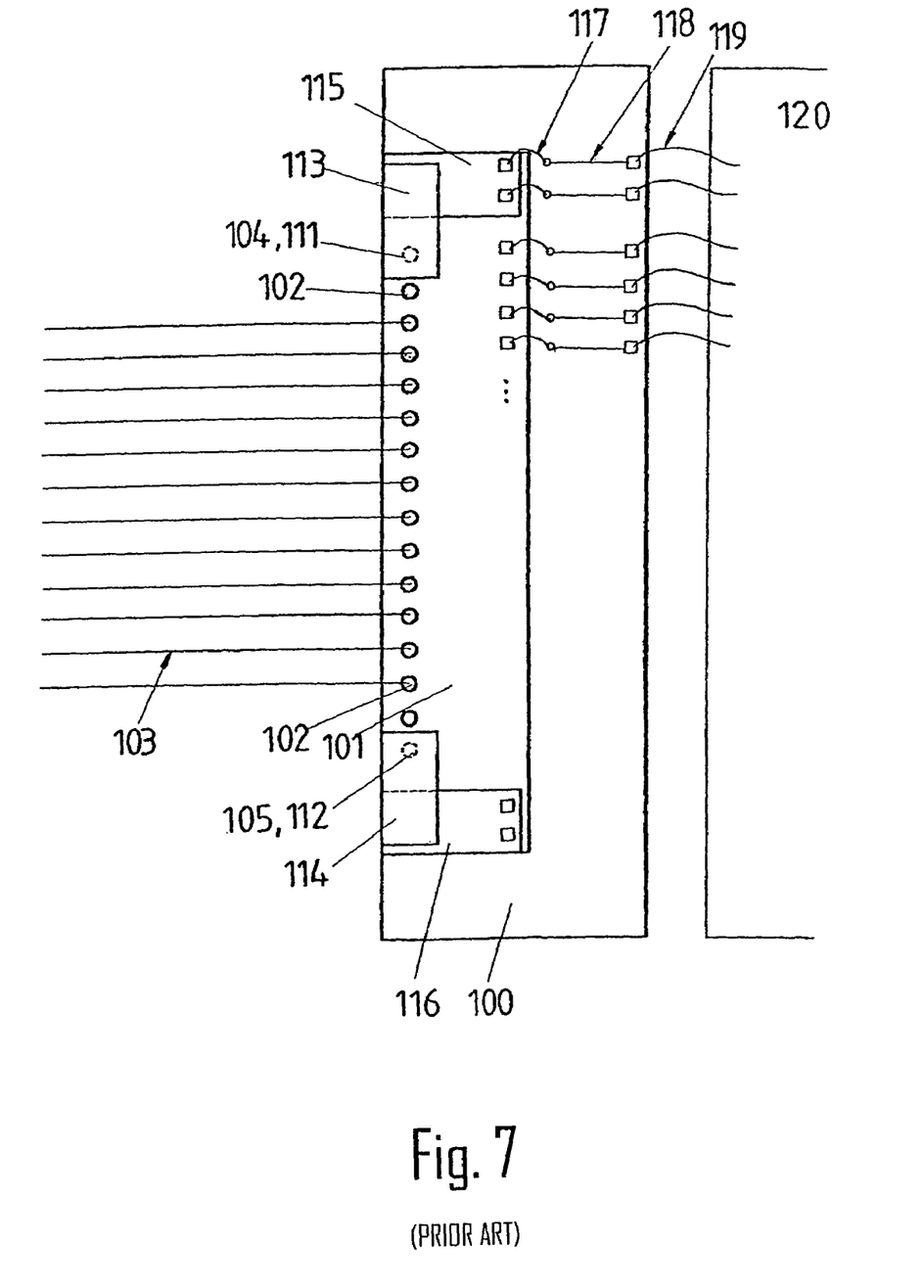
FIG. 7 shows a photodiode arrangement known from the prior art.

A corresponding construction known in the prior art is shown diagrammatically in FIG. 7. Accordingly, a laser diode array 101, comprising sixteen VCSEL diodes 102 in the exemplary embodiment illustrated, is arranged on a submount 100. Twelve of these laser diodes 102 serve for data communication and they are accordingly assigned in each case a diagrammatically illustrated optical waveguide 103. The two laser diodes 104, 105 situated at the edge of the array 101 are respectively assigned a monitor diode 111, 112 which is composed of gallium arsenide and whose optically active area is positioned directly above the respective outermost laser diode 104, 105 and faces the latter.

As an alternative, it would also be possible to provide the optically active area of the photodiode at the side remote from the laser diodes 104, 105, that is to say at the top. However, a deflection optical arrangement would then be necessary in order to direct the laser beam onto the optically active area of the monitor diode.

The monitor diode 111, 112 is respectively formed in a carrier 113, 114, which is fixed to a submount 115, 116 serving as spacer element or spacer. The submount is a ceramic carrier.

The monitor diodes 111, 112 and also the laser diodes 102, 104, 105 are contact-connected via bonding wires 117, which are connected via metallizations 118 and further bonding wires 119 to contacts of a diagrammatically illustrated control and driver circuit 120.

Submount 115, 116 and monitor diode 111, 112 are positioned at a right angle with respect to one another, so that, on the one hand, the monitor diode projects with its optically active area over the spacer and, on the other hand, there is space on the spacer for contact pads for connecting the bonding wires 119.

The two monitor diodes 111, 112 are usually used in such a way that the optical output power of the laser diodes 102 is regulated with the aid of one monitor diode 111, while the other laser diode 112 effects a safety shutdown for the case where the laser power exceeds a predetermined limit value. Such instances of regulation are known per se.

For the electrical and mechanical connection of submount 115, 116 and monitor diode 111, 112, it is known to connect the two chips by means of flip-chip mounting. Flip-chip mounting aligns the two singulated components by turning one chip and subsequently positioning it on the other chip located in a workpiece carrier. In this method, the fact that one component has to be positioned in a workpiece carrier after singulation is disadvantageous. The method is time-consuming and the small size of the singulated chips (approximately 2 mm×2 mm) is difficult to handle. Moreover, the method is cost-intensive which it involves a single-chip process, i.e. complicated and expensive individual productions.

SUMMARY OF THE INVENTION

Therefore, the present invention is based on an aspect of providing a photodiode arrangement and a method for producing a connection between a first semiconductor component and a second semiconductor component which make it possible to connect the semiconductor components using standard processes and, at the same time, in an economical and effective manner.

This present invention is achieved by means of a photodiode arrangement having the features of the independent claim or claims. Preferred and advantageous refinements of the invention are specified in the subclaims.

Accordingly, in a first aspect, the solution according to the invention is distinguished by a photodiode arrangement in which a photodiode and a submount for contact-connecting the photodiode are connected to one another by eutectic bonding. In this case, the two elements in each case have a corresponding metallization on the side facing each other. A submount is understood to be a carrier element for the photodiode.

In a second aspect, the invention provides a method for producing a connection between a first semiconductor component and a second semiconductor component which have a different outer contour. In particular, the method serves for connecting a photodiode to a submount for the production of a photodiode arrangement.

The method comprises:

a) producing a multiplicity of first semiconductor components on a first wafer,
b) producing a multiplicity of second semiconductor components on a second wafer, in this case
c) providing a metallization on the first semiconductor components of the first wafer,
d) providing a metallization on the second semiconductor components of the second wafer,
e) forming trenches in the first and/or the second semiconductor components, then
f) connecting the two wafers by eutectic bonding of the respective metallizations, the resulting wafer composite having a front side and a rear side, then g) singulating the front side of the wafer composite in accordance with a first outer contour of the first semiconductor components to be singulated, only the first wafer being severed, and subsequently h) singulating the rear side of the wafer composite in accordance with a second outer contour of the second semiconductor components to be singulated, only the second wafer being severed.

Consequently, according to the invention, the semiconductor components to be connected are connected to one another as early as in the wafer composite. This is done by eutectic bonding of the metallizations formed on the respective semiconductor components. By way of example, a gold metallization is situated on one wafer and a gold-tin metallization is situated on the other wafer. The trenches which are etched into the respective surface before the bonding operation ensure that the photodiode and the submount are connected to one another only at defined locations. The formation of trenches thus results in a topographic processing of the wafers at the locations at which no connection of the wafers is required.

In order to produce different outer contours of the semiconductor components to be singulated on the two sides of the wafer composite, firstly the front side and then—preferably after the wafer composite has been turned—the rear side are singulated. The singulation is preferably effected by sawing the respective side. Thus, the complete wafer composite is not separated, but rather only the component respectively located at the top. It is thereby possible to produce end components in the wafer process which have different contours, in particular are arranged in angled fashion with respect to one another.

After singulation, the end components are released from the wafer composite and supplied to an automated apparatus for further processing, which apparatus may for example be a so-called "blue-tape", a workpiece carrier.

The method according to the invention is extremely effective and time-saving since up to several thousand semiconductor components can be mounted on one another simultaneously. In this case, in an advantageous manner, tried and tested methods are combined with one another in a new way and it is possible to have recourse to existing logistical chains. The method can be applied to all semiconductor components which are individually connected to one another in each case by flip-chip mounting. In this case, it merely has to be possible for the metallizations that are necessary for eutectic bonding to be applied to the respective semiconductor components as early as in the wafer assemblage.

Use of eutectic substance mixtures (e.g. gold-tin with gold) lowers the melting point for the bonding of the metallizations, so that structures of the semiconductor components that are formed on the wafers, for example optically active regions of a photodiode, are not destroyed or damaged during the bonding of the wafers.

Alignment marks ensuring precise positioning of the respective wafers on one another are preferably situated on the wafers.

The respective semiconductor components, i.e. in particular in each case a photodiode and a submount, are preferably silicon chips. Silicon is a relatively inexpensive material and it is possible to have recourse to already tried and tested processing methods.

BRIEF DESCRIPTION OF THE DRAWINGS

The invention is explained in more detail below using a plurality of embodiments with reference to the figures of the drawing, in which.

A photodiode arrangement known in the prior art was described in the introduction with reference to FIG. 7 in order to elucidate the background of the invention.

DETAILED DESCRIPTION OF THE INVENTION

Figure 1:
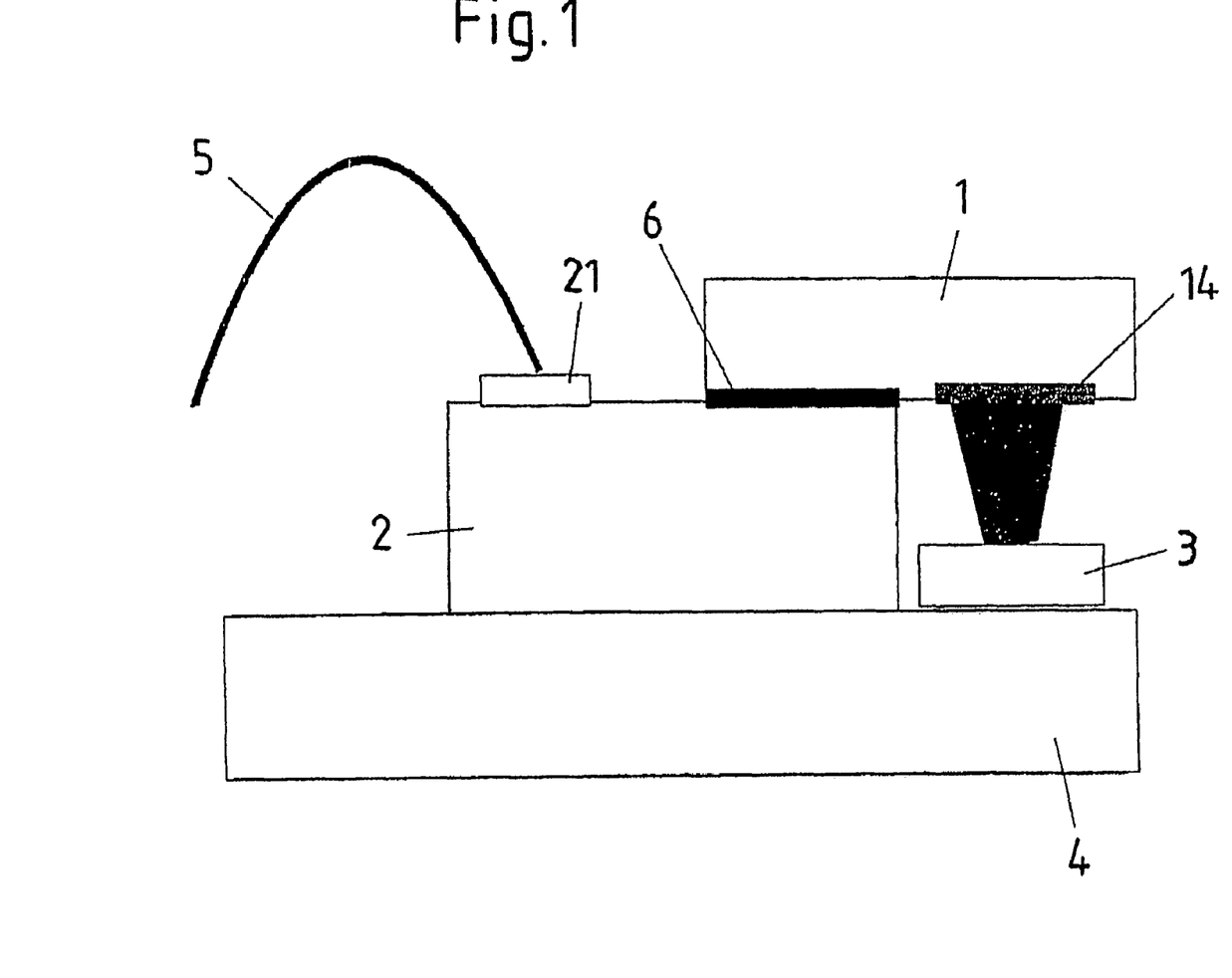
FIG. 1 shows a lateral view of a photodiode arrangement with a photodiode and a submount for carrying and contact-connecting the photodiode.

FIG. 1 shows a photodiode arrangement in which a monitor diode 1 is arranged on a spacer 2. Both the spacer 2 and an array 3 of vertically emitting semiconductor lasers (VCSEL) are positioned on a common carrier 4 in such a way that light emitted by a lateral semiconductor laser of the array is detected directly by the monitor diode 1, the downwardly oriented optically active layer 14 of which projects over the spacer 2.

The monitor diode 1 is preferably a silicon photodiode. The submount 2 is likewise preferably a silicon chip. The two components 1, 2 in each case have metallizations. In this case, the metallizations of the spacer 2 can each be connected to a bonding wire via a contact pad 21. The two components 1, 2 are connected by means of eutectic bonding whilst still in the wafer composite, as a result of which the monitor diode 1 and the submount 2 are electrically and also mechanically connected to one another in a region 6. This is explained in more detail below with reference to FIGS. 2 to 5.

Figure 2:
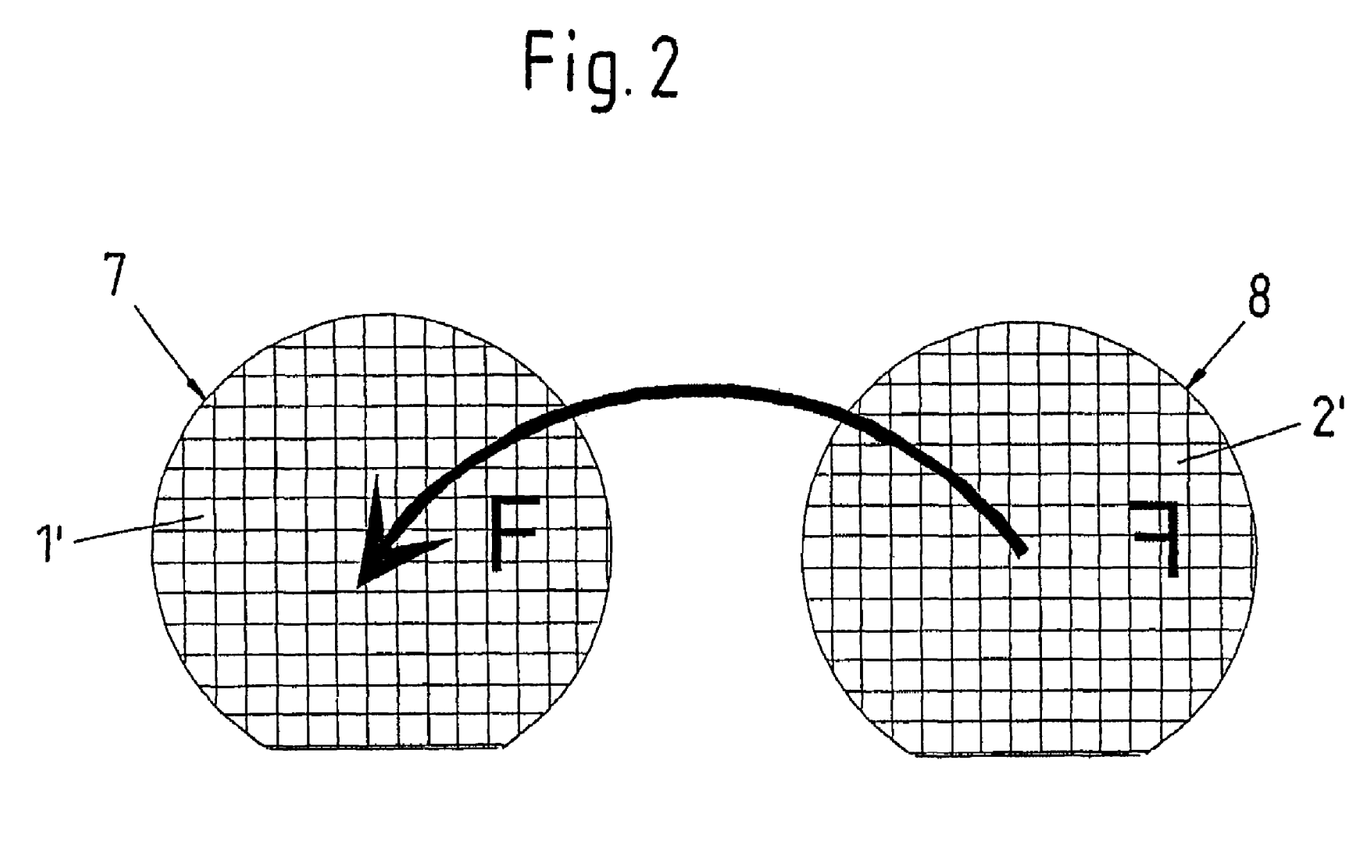
FIG. 2 shows two wafers that are to be connected by means of eutectic bonding prior to connection.
Figure 3:
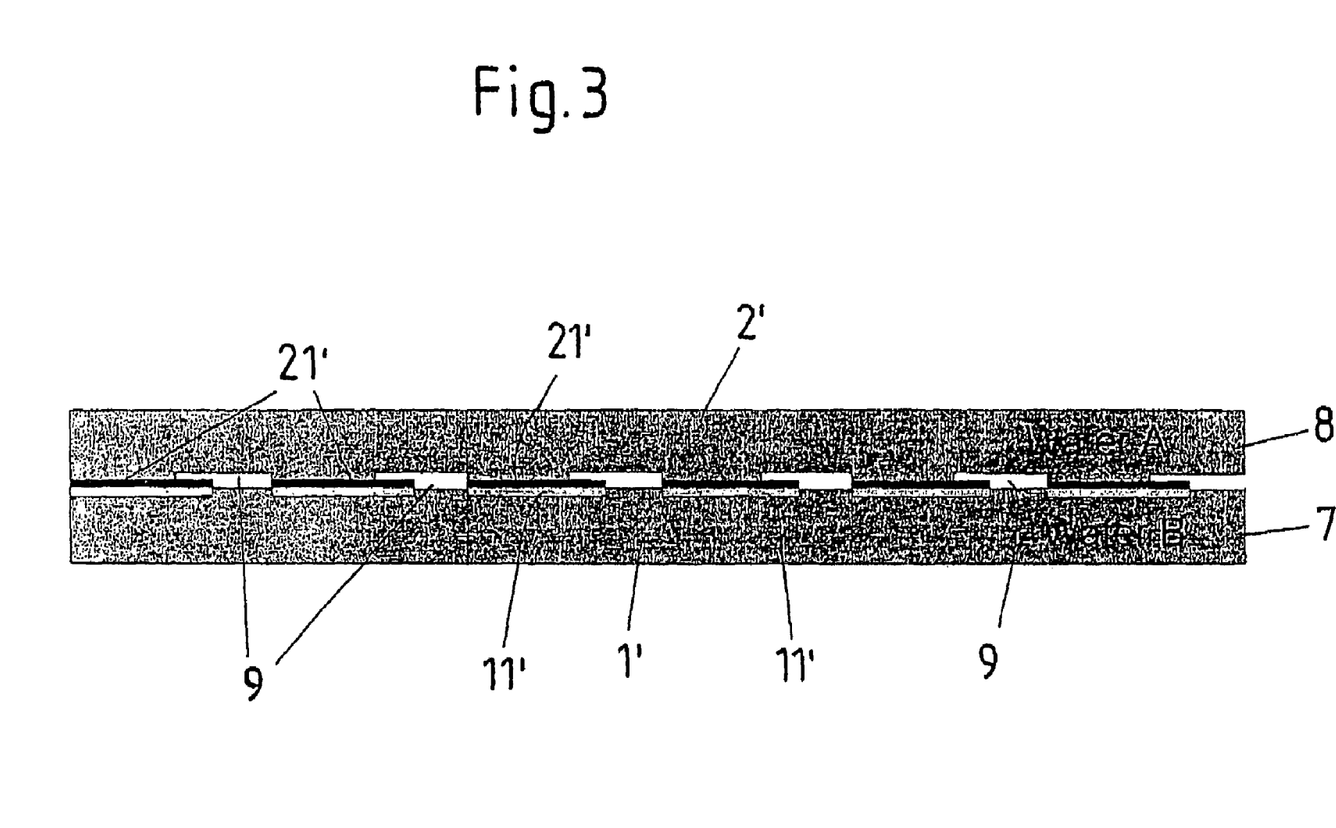
FIG. 3 shows the two wafers connected by eutectic bonding.
Figure 4:
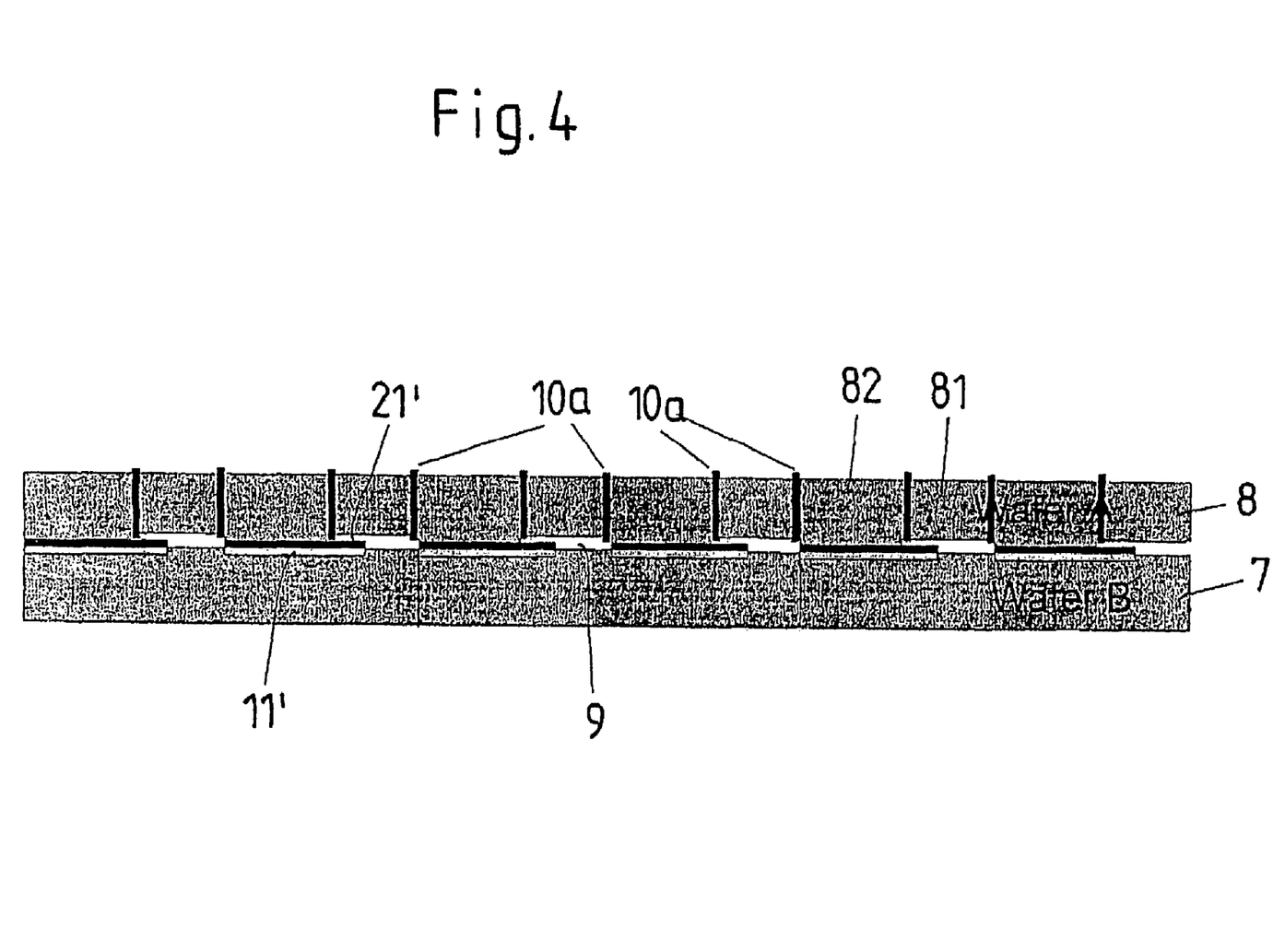
FIG. 4 shows a first singulation process at one side of the wafers connected to one another.
Figure 5:
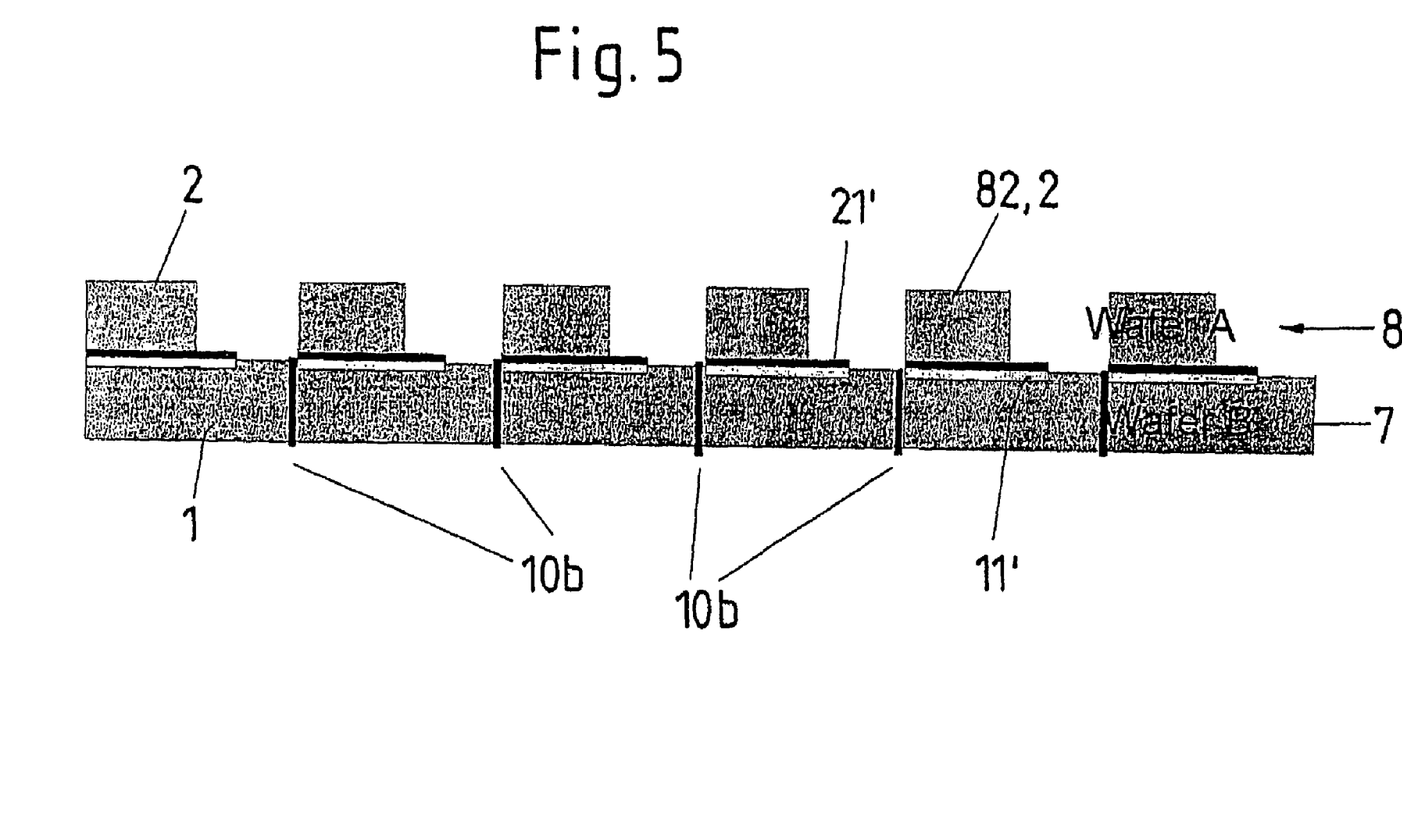
FIG. 5 shows a second singulation process at the other side of the wafers connected to one another.

In accordance with FIG. 2, a multiplicity of semiconductor components 1', 2' are in each case patterned on the front side of a first wafer 7 and the front side of a second wafer 8 in a manner known per se. In particular, the semiconductor components 1' of the first wafer 7 are photodiodes having optically active areas and the semiconductor components 2' of the second wafer 8 are submounts as are used in the arrangement of FIG. 1.

The two wafers 7, 8 are placed with their surfaces one on top of the other and directly connected to one another by means of eutectic bonding. In accordance with FIG. 3, the two wafers 7, 8 here in each case have a metallization 11', 21'. One metallization is preferably a gold metallization 11', and the other metallization is preferably a gold-tin metallization 21'. Furthermore, trenches or cutouts 9 are provided in the surface of at least one wafer. The cutouts 9 ensure that a connection between the two wafers is effected only in defined regions. Alignment aids (so-called fiducials) are also provided (not illustrated) on the wafers 7, 8. The eutectic bonding of the two wafers is effected in a manner known per se.

After the two wafers 7, 8 have been connected, it is necessary to perform a singulation of the desired components. In this case, in accordance with FIG. 4, firstly only one wafer 8 of the wafer composite 7, 8 is singulated. This is effected by sawing one side of the wafer composite 7, 8 along the lines 10-a. In this case, one wafer 8 is singulated along lines 10-a which give the semiconductor components 1' to be singulated a first desired outer contour. The residual regions 81, which are situated in the region of the cutouts 9 and are now no longer connected to the wafer composite 7, 8, are removed, the regions 82 that are eutectically bonded to the other wafer 7 remaining, which regions represent the desired semiconductor components 2.

After singulation of one wafer 8 of the wafer composite 7, 8, the other side or the other wafer 7 of the wafer composite 7, 9 is singulated, for which purpose the latter is preferably, but not necessarily, turned (in order that a sawing tool has to be arranged only at one side). In accordance with FIG. 5, the wafer 7 is singulated by sawing along the lines 10-*b*. In this case, the semiconductor components to be singulated are given a second desired outer contour, which deviates from the outer contour of the first semiconductor components 2. After singulation of the second wafer 7 as well, the end components that remain are already connected units comprising the two semiconductor components 1, 2, which are for example a monitor diode 1 and a submount 2 in accordance with FIG. 1.

Instead of singulation by sawing, the wafers 7, 8 may also be singulated by other separation techniques.

Figure 6:
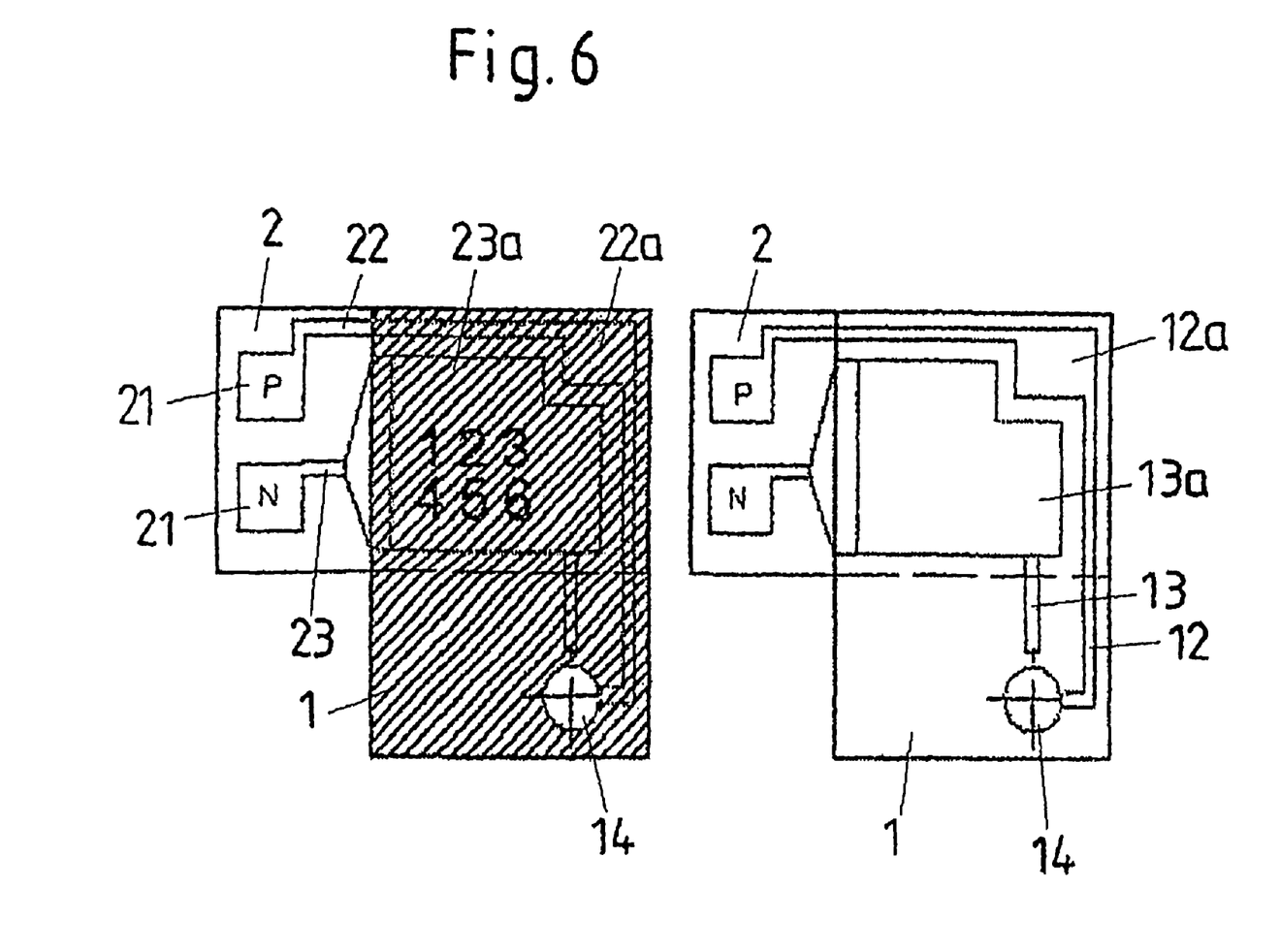
FIG. 6 shows a plan view of a photodiode arrangement that has resulted from the singulation process.

FIG. 6 shows the metallizations of the two semiconductor components for the example of a monitor diode 1 and a submount 2. The monitor diode 1 has an optically active region 14, which is electrically contact-connected via metallizations 12, 13. The metallizations 12, 13 respectively merge with areal metallization regions 12*a*, 13*a*. The submount 2 has two contact pads 21 for contact-connecting the monitor diode 1, which are respectively connected to metallizations 22, 23. The metallizations 22, 23 correspond, in terms of their geometry in an overlap region in which the monitor diode 1 and the submount 2 are eutectically bonded to one another, to the metallizations 12, 13 of the monitor diode and form areal metallization regions 22*a*, 23*a*, so that the respective metallizations 22*a*, 12*a*; 23*a*, 13*a* bear on one another.

The invention claimed is:

1. A photodiode arrangement, comprising:
   a photodiode; and
   a submount that is electrically contact-connected to the photodiode,
   wherein the photodiode comprises a first metallization on a side facing the submount, the submount comprises a second metallization on a side facing the photodiode, the first metallization and the second metallization defining a eutectic mixture, and the photodiode and the submount are directly bonded to one another by the eutectic mixture of the first and second metallizations.

2. The arrangement as claimed in claim 1, further comprising one or more alignment marks situated on the photodiode or the submount or on both the photodiode and the submount.

3. The arrangement as claimed in claim 1, wherein the photodiode or the submount or both comprise a silicon chip.

4. The arrangement as claimed in claim 1, wherein the photodiode and the submount each have an outer contour that differs from one another and, accordingly, comprise regions that protrude relative to one another.

5. The arrangement as claimed in claim 4, further comprising contact pads situated on a region of the submount that protrudes with respect to the photodiode, wherein said contact pads are connected to the second metallization of the submount.

6. The arrangement as claimed in claim 4, wherein the photodiode comprises an optically active area situated on a region of the photodiode that protrudes with respect to the submount.

7. The arrangement as claimed in claim 1, wherein the first metallization of the photodiode comprises a gold metallization and the second metallization of the submount comprises a gold-tin metallization, or vice versa.

8. The arrangement as claimed in claim 1, wherein one of the photodiode and the submount comprise a trench or cutout on the side facing the other of the photodiode and the submount, thereby ensuring a connection between the photodiode and the submount only in defined regions not associated with the trench.

9. The arrangement of claim 1, wherein the first metallization extends to an optically active region of the photodiode, the optically active region of the photodiode located opposite a corresponding window in the submount.

10. The arrangement of claim 1, wherein the second metallization extends to a pair of contact pads on the submount that are spaced from the photodiode.

11. The arrangement of claim 9, wherein the second metallization extends to a pair of contact pads on the submount that are spaced from the photodiode.

12. The arrangement of claim 11, wherein the first and second metallizations are each planar.

13. The arrangement of claim 1, wherein the first and second metallizations are each planar.

14. The arrangement of claim 1, wherein the second metallization has a different composition than the first metallization, the first metallization and the second metallization together defining the eutectic mixture.

* * * * *